(12) United States Patent
Dickinson

(10) Patent No.: US 10,920,315 B2
(45) Date of Patent: Feb. 16, 2021

(54) PLASMA FORELINE THERMAL REACTOR SYSTEM

(71) Applicant: Applied Materials, Inc., Santa Clara, CA (US)

(72) Inventor: Colin John Dickinson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 69 days.

(21) Appl. No.: 16/368,170

(22) Filed: Mar. 28, 2019

(65) Prior Publication Data

US 2019/0226083 A1 Jul. 25, 2019

Related U.S. Application Data

(63) Continuation of application No. 14/630,631, filed on Feb. 24, 2015, now abandoned.

(60) Provisional application No. 61/949,217, filed on Mar. 6, 2014.

(51) Int. Cl.
*C23C 16/44* (2006.01)
*H01J 37/32* (2006.01)

(52) U.S. Cl.
CPC ...... *C23C 16/4412* (2013.01); *C23C 16/4405* (2013.01); *H01J 37/32834* (2013.01); *H01J 37/32844* (2013.01); *Y02C 20/30* (2013.01)

(58) Field of Classification Search
CPC ............. C23C 16/4412; C23C 16/4405; H01J 37/32834; H01J 37/32844; Y02C 20/30
See application file for complete search history.

(56) References Cited

U.S. PATENT DOCUMENTS

| 6,045,618 A | 4/2000 | Raoux et al. |
| 6,156,667 A | 12/2000 | Jewett |
| 6,291,938 B1 | 9/2001 | Jewett et al. |

(Continued)

FOREIGN PATENT DOCUMENTS

| CN | 102317686 A | 1/2012 |
| CN | 102640255 A | 8/2012 |

(Continued)

OTHER PUBLICATIONS

Chinese Office Action for Application No. 201580009058.5 dated Oct. 29, 2019.
Japanese Office Action for Application No. JP 2016-573647 dated Dec. 9, 2019.
U.S. Appl. No. 62/0070,513, filed Jun. 4, 2014, entitled "Reagent Delivery System Freeze Prevention Heat Exchanger".

(Continued)

*Primary Examiner* — Yuechuan Yu
(74) *Attorney, Agent, or Firm* — Patterson + Sheridan, LLP

(57) ABSTRACT

The present disclosure relates to methods and apparatus for treating vacuum processing system exhaust gases. In addition, methods and apparatus for maintenance of foreline plasma reactor subsystems are disclosed. In some embodiments, an apparatus for treating an exhaust gas in a foreline of a vacuum processing system includes a plasma source coupled with a foreline of a process chamber, a treatment agent source coupled with the plasma source, and a downstream trap to cool an exhaust stream and trap particles in the exhaust stream. In some embodiments, multiple foreline plasma reactor subsystems are used with a vacuum processing system, and one foreline plasma reactor subsystem can be isolated and maintained (e.g., cleaned) while exhaust gas treatment continues in another foreline plasma reactor subsystem and processing continues in the vacuum processing system.

20 Claims, 6 Drawing Sheets

(56) References Cited

U.S. PATENT DOCUMENTS

| | | |
|---|---|---|
| 2006/0198769 A1 | 9/2006 | Pokharna et al. |
| 2010/0024654 A1 | 2/2010 | Shaw et al. |
| 2011/0135552 A1 | 6/2011 | Dickinson et al. |
| 2012/0090338 A1 | 4/2012 | Czerniak et al. |

FOREIGN PATENT DOCUMENTS

| | | |
|---|---|---|
| CN | 203002192 U | 6/2013 |
| JP | H04150903 A | 5/1992 |
| JP | H04355922 A | 12/1992 |
| JP | H05195952 A | 8/1993 |
| JP | H115012 A | 1/1999 |
| JP | 2000026971 A | 1/2000 |
| JP | 2000262841 A | 9/2000 |
| JP | 2002273169 A | 9/2002 |
| JP | 2005142377 A | 6/2005 |
| KR | 10-2010-0026707 A | 3/2010 |
| TW | 200620458 A | 6/2006 |
| TW | 201030798 A | 8/2010 |
| TW | 201144475 A | 12/2011 |

OTHER PUBLICATIONS

U.S. Appl. No. 14/445,965, filed Jul. 29, 2014, entitled "Apparatus for Treating a Gas in a Conduit".
U.S. Appl. No. 12/957,539, filed Dec. 1, 2010 entitled "Methods and Apparatus for Treating Exhaust Gas in a Processing System".
U.S. Appl. No. 14/300,372, filed Jun. 10, 2014 entitled "Methods and Apparatus for Treating Exhaust Gas in a Processing System".
U.S. Appl. No. 13/860,572, filed Apr. 11, 2013 entitled "Apparatus for Treating an Exhaust Gas in a Foreline".
U.S. Appl. No. 14/184,667, filed Feb. 19, 2014 entitled "Gas Sleeve for Foreline Plasma Abatement System".
International Search Report International Search Report dated May 29, 2015 for Application No. PCT/US2015/015048.
Chinese Office Action (with attached English translation of the Search Report) for Application No. 201580009058.5; dated Feb. 24, 2018; 16 total pages.
Japanese Office Action dated Feb. 14, 2019 for Application No. 2016-573647.
Taiwan Office Action dated Sep. 11, 2019 for Application No. 104107225.
Chinese Office Action dated Apr. 30, 2019 for Application No. 201580009058.5.
CN Office Action dated Oct. 29, 2019 for Application No. 201580009058.5.

PLASMA FORELINE THERMAL REACTOR SYSTEM

CROSS-REFERENCE TO RELATED APPLICATIONS

This application is a continuation of U.S. application Ser. No. 14/630,631 filed Feb. 24, 2015, which claims benefit of U.S. provisional application Ser. No. 61/949,217, filed Mar. 6, 2014, which is herein incorporated by reference.

BACKGROUND

Field

Embodiments of the present disclosure generally relate to vacuum processing techniques. More particularly, embodiments of the present disclosure relate to a system for controlling reactions and condensation of exhaust gases from a vacuum processing system and cleaning methods for the same system.

Description of the Related Art

The flat panel display and semiconductor industries, as well as other industries, use vacuum processing (e.g., chemical vapor deposition (CVD)) techniques to produce high-purity solid materials. The process is often used to produce thin films. In many vacuum processing techniques, the substrate (e.g., a wafer) is exposed to one or more volatile precursor gases (i.e., vapors), which react with and/or decompose on the substrate surface to produce the desired deposit. Frequently, by-product gases are also produced, which may be pumped from the reaction chamber.

The process gases used by CVD and other vacuum processing facilities include many compounds which must be abated or treated before disposal, due to regulatory requirements and environmental concerns. Frequently, some of the process gases do not form a deposit on the substrate, and are pumped from the reaction chamber with by-product gases, if any. The gases pumped from the reaction chamber are collectively referred to as exhaust gases.

The exhaust gases pumped from the reaction chamber may react with and/or condense on pipes, pumps, and other equipment through which they flow after being pumped from the reaction chamber. If steps are not taken to prevent the reaction or condensation of the exhaust gases, pipes may be blocked and pumps may be damaged by the accumulation of chemicals deposited by the exhaust gases. If there is no effective way to clean the undesired deposits from the equipment in situ, then the equipment must be removed or shut down for cleaning "off-line". If the equipment has to be opened to accomplish cleaning, this may lead to excessive reaction chamber down-time. This problem exists in many types of vacuum processing chambers, such as etch reactors, ion implant chambers, plasma treatment chambers, atomic layer deposition chambers, and the like.

There is a need, therefore, for improved treatment and maintenance techniques.

SUMMARY

A foreline plasma reactor subsystem for treating exhaust gases of a vacuum processing chamber is provided. The foreline plasma reactor subsystem generally includes a plasma source having an inlet configured to couple with the vacuum processing chamber and a downstream trap coupled with an outlet of the plasma source. The method performed therein generally includes generating a plasma in the plasma source from one or more gases, mixing the plasma with exhaust gases, cooling the plasma and exhaust gas mixture in the trap, and trapping particles formed from the plasma and exhaust gas mixture in the trap.

In another embodiment, a foreline plasma reactor subsystem for treating exhaust gases of a vacuum processing chamber is provided. The foreline plasma reactor subsystem generally includes a plasma source coupled with the vacuum processing chamber, a first valve operable to isolate the plasma source from the vacuum processing chamber, a maintenance purge gas supply coupled with the plasma source, a downstream trap coupled with an outlet of the plasma source, a second valve operable to isolate the downstream trap from a vacuum pump, and a maintenance vent valve operable to allow gases from the downstream trap to bypass the vacuum pump and flow directly to an abatement subsystem.

In another embodiment, a foreline plasma reactor system for treating exhaust gases of a vacuum processing system is provided. The foreline plasma reactor system generally includes a valve operable to direct exhaust gases into one of at least two foreline plasma reactor subsystems, wherein each foreline plasma reactor subsystem comprises a plasma source coupled with the valve, a downstream trap coupled with the plasma source, a maintenance purge gas supply coupled with the plasma source, and a maintenance vent valve operable to allow gases from the downstream trap to bypass a vacuum pump of the vacuum processing system and flow directly to an abatement subsystem of the vacuum processing system; and a valve downstream of each foreline plasma reactor subsystem operable to isolate each foreline plasma reactor subsystem from the vacuum pump.

In another embodiment, a method for preventing particles from accumulating in a vacuum pump and foreline of a vacuum processing system is provided. The method generally includes mixing a plasma with exhaust gas from the vacuum processing system and thereby forming an exhaust stream, cooling the plasma and exhaust gas mixture, and trapping particles formed from the plasma and exhaust gas mixture.

In another embodiment, a method for maintaining a foreline plasma reactor subsystem used in vacuum processing is provided. The method generally includes isolating the foreline plasma reactor subsystem from exhaust gases and a vacuum pump by operating valves, supplying (i.e., introducing) a purge gas to the foreline plasma reactor subsystem, opening a valve from the foreline plasma reactor subsystem to an abatement subsystem, and abating the purge gas and compounds, formed (e.g., from the purge gases and exhaust gases) in the foreline plasma reactor subsystem, in the abatement subsystem.

In another embodiment, a method for treating exhaust gases from vacuum processing (e.g., CVD) operations while simultaneously maintaining (e.g., cleaning) a first foreline plasma reactor subsystem is provided. The method generally includes operating a first valve to direct exhaust gases away from the first foreline plasma reactor subsystem and into a second foreline plasma reactor subsystem, operating a second valve to isolate the first foreline plasma reactor subsystem from a vacuum pump and connect the second foreline plasma reactor subsystem with the vacuum pump, introducing at least one purge gas into the first foreline plasma reactor subsystem, operating a third valve to allow gases to flow from the first foreline plasma reactor subsystem into an abatement subsystem, and abating the purge gas and compounds formed in the first foreline plasma reactor subsystem in the abatement subsystem in the abatement subsystem.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

A foreline plasma reactor subsystem and methods for treating exhaust of a vacuum processing system are provided. The foreline plasma reactor subsystems enable treatment of vacuum processing exhaust gases with reduced particulate accumulation and damage to vacuum pumps and downstream effluent handling equipment. For example, the foreline plasma reactor subsystem described herein treats exhaust gases such that the exhaust gases form particles in the foreline plasma reactor subsystem, where the particles are trapped, and form a reduced number of particles in downstream pumps, pipes, and other equipment.

One embodiment disclosed herein generates a plasma, mixes the plasma with exhaust gases, cools the mixture of exhaust gases and plasma, and traps particles formed from the mixture of exhaust gases and plasma. The plasma heats the exhaust gases and may react with the exhaust gases to form other substances. Cooling the mixture of exhaust gases and plasma may cause gases to condense onto or react with surfaces of a trap.

Another embodiment, which is not strictly related to the first, is to clean a foreline plasma reactor subsystem by using valves to isolate the foreline plasma reactor subsystem from exhaust gases and a vacuum pump, supply a purge gas to the foreline plasma reactor subsystem, and open a valve from the subsystem to an abatement system. For example, a foreline plasma reactor subsystem may be isolated from exhaust gases and purged with oxygen. A valve may be opened between the foreline plasma reactor subsystem and a burn/wet abatement subsystem, and the oxygen may entrain particles from the foreline plasma reactor subsystem and carry them to the burn/wet abatement subsystem, where they may be combusted and trapped.

Another embodiment, which is not strictly related to the first and second embodiments, is a foreline plasma reactor subsystem comprising at least two forelines, a plasma source for each of the forelines, a downstream trap on each of the forelines, a valve downstream of the traps operable to isolate each of forelines from a vacuum pump, and a maintenance vent valve operable to allow gases from a foreline to bypass the vacuum pump and flow directly to an abatement subsystem.

Another embodiment, which is not strictly related to the first, second, and third embodiments, is to operate a first valve to direct exhaust gases into a first foreline plasma reactor subsystem and away from a second foreline plasma reactor subsystem, operate a second valve to allow gases to flow from the first foreline plasma reactor subsystem to a vacuum pump while isolating the second foreline plasma reactor subsystem from the vacuum pump, introduce purge gases into the second foreline plasma reactor subsystem, and operate a third valve to allow gases to flow from the second foreline plasma reactor subsystem into an abatement subsystem.

Figure 1:
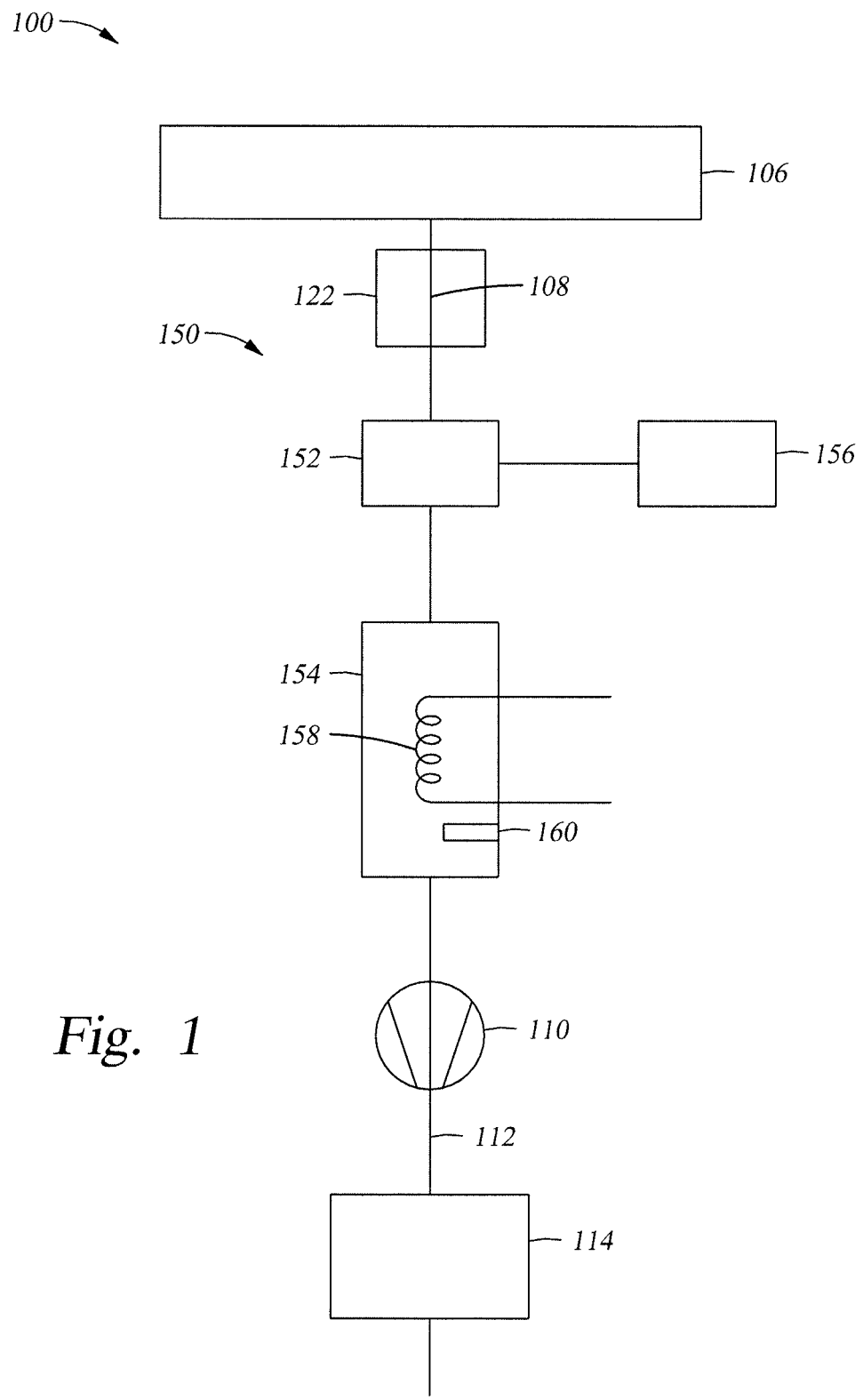
FIG. 1 illustrates a schematic diagram of a vacuum processing system, according to certain aspects of the present disclosure.

FIG. 1 is a schematic diagram of a vacuum processing system 100 incorporating a foreline plasma reactor subsystem 150, according to one embodiment. In one embodiment, the foreline plasma reactor subsystem 150 includes a plasma source 152, a foreline gas chiller (i.e., trap) 154, and a treatment agent (e.g., reactant gas) source 156.

The vacuum processing system 100 includes a vacuum processing chamber 106 such as an etch reactor processing chamber, an ion implant chamber, a plasma treatment chamber, an atomic layer deposition chamber, etc. In the embodiment depicted in FIG. 1, vacuum processing chamber 106 is a CVD chamber. An optional heater 122, for example a resistive band heater, may be disposed adjacent to the foreline 108 to heat the foreline 108 and exhaust gases within the foreline 108. The heater 122 may be utilized to maintain the surfaces of the foreline 108 disposed between the vacuum processing chamber 106 and plasma source 152 at a temperature that prevents condensation of materials in the exhaust gases on the sidewalls of the foreline 108.

The plasma source 152 is disposed downstream of the vacuum processing chamber 106, with the inlet of the plasma source 152 coupled with the vacuum processing chamber 106. The outlet of the plasma source 152 is coupled with the foreline gas chiller 154. The foreline gas chiller 154 may comprise coolant coils 158 to cool the plasma and exhaust gas mixture. The foreline 108 allows exhaust gases to flow from the vacuum processing chamber 106 to the plasma source 152, from the plasma source 152 to the foreline gas chiller 154, and from the foreline gas chiller 154 to a process vacuum pump 110. An exhaust line 112 allows gases to flow from the process vacuum pump 110 to an abatement subsystem 114.

The plasma source 152, foreline 108, process vacuum pump 110, and associated hardware may be formed from one or more process-compatible materials, such as aluminum, anodized aluminum, nickel plated aluminum, stainless steel, and combinations and alloys thereof, for example. The foreline gas chiller 154 may be formed of similar process-compatible materials, or may be formed of materials conducive to condensation of the exhaust gases, for example. The abatement subsystem 114 may be a burn/wet abatement subsystem, as is known in the semiconductor fabrication industry, for example.

The plasma source 152 is supplied with one or more treatment agents (not shown), for example oxygen $O_2$, from the treatment agent source 156, and the plasma source 152 generates a plasma from the treatment agents. The plasma source 152 may generate the plasma by various techniques, including radio frequency (RF), direct current (DC), or microwave (MW) based power discharge techniques. The plasma may also be generated by a thermally based technique, a gas breakdown technique, a high intensity light source (e.g., UV energy), or exposure to an x-ray source. The plasma source 152 mixes the generated plasma with exhaust gases, which heats the exhaust gases. In some embodiments, the plasma also reacts with the exhaust gases to form other substances, which may not be in the form of gases. For example, the plasma may react with the exhaust gases to form particles of silicon dioxide $SiO_2$. The mixture of plasma, exhaust gases, and other substances may be referred to as an exhaust stream herein below.

The foreline gas chiller 154 chills the exhaust stream. The foreline gas chiller 154 may be supplied with process cooling water (PCW, not shown) or carbon dioxide $CO_2$ (not shown) in order to cool the foreline 108 and the exhaust stream passing through the foreline. For example, PCW, $CO_2$, or Freon-type refrigerant may be circulated through the coolant coils 158 in order to cool the exhaust stream. According to certain embodiments, the foreline gas chiller 154 may comprise cooled collection plates 160, instead of or in addition to the coolant coils 158, to provide a good surface area interface between the exhaust stream and cold surfaces. The foreline gas chiller 154 may be supplied with PCW to chill the exhaust stream to approximately 10 degrees Celsius, for example. Chilling the exhaust stream may cause some of the exhaust stream to condense onto and/or react with surfaces of the foreline gas chiller 154, which incorporates a trap structure in order to trap particles condensing or reacting onto the foreline gas chiller 154 surfaces.

The exhaust stream, minus any particles trapped in the foreline gas chiller 154, exits the foreline gas chiller 154 and flows to the process vacuum pump 110. The condensation and reaction of the exhaust stream in the foreline gas chiller 154 reduces the amount of particles deposited by the exhaust stream in the process vacuum pump 110, allowing the process vacuum pump 110 to have a longer lifespan and longer times between required maintenance. For example, a process vacuum pump may remain in service for two to three months between maintenance activities when used without a foreline plasma reactor subsystem, but may remain in service for six to twelve months between maintenance activities when used with a foreline plasma reactor subsystem.

Figure 2:
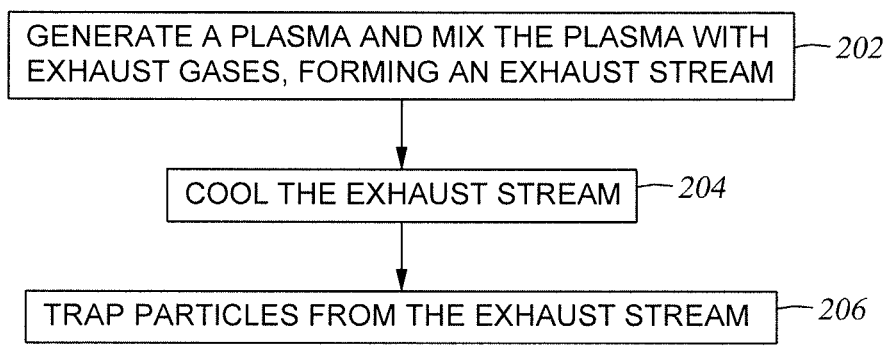
FIG. 2 illustrates an exemplary operation to prevent particles from accumulating in a vacuum pump and foreline of a vacuum processing system, according to certain aspects of the present disclosure.

FIG. 2 illustrates an exemplary operation 200 to prevent particles from accumulating in a vacuum pump and foreline of a vacuum processing system (e.g., vacuum processing system 100) that may be performed, for example, by a foreline plasma reactor subsystem, in accordance with certain aspects of the present disclosure. As illustrated, at block 202, a plasma source generates a plasma and mixes the plasma with exhaust gases, forming an exhaust stream. For example, with reference to FIG. 1, a plasma source 152 may generate a plasma from oxygen and mix the plasma with exhaust gases from the vacuum processing chamber 106, forming an exhaust stream. The operation continues at block 204 (see FIG. 2) by cooling or chilling the exhaust stream.

For example (see FIG. 1), the foreline gas chiller 154 may allow cooling water to pass through coils surrounding the foreline 108, cooling the foreline and the exhaust stream to 10 degrees Celsius. At block 206 (see FIG. 2), the operation continues by trapping particles from the exhaust stream. For example (see FIG. 1), particles may be trapped in a set of baffles, on which the particles condense, within the foreline gas chiller 154.

According to certain embodiments, the foreline gas chiller 154 may cool the plasma and exhaust gas mixture by passing a halocarbon-type refrigerant (e.g., chlorofluorocarbons or hydrofluorocarbons) or chilled $CO_2$ through coils around the foreline, or by other means known in the industry.

Figure 3:
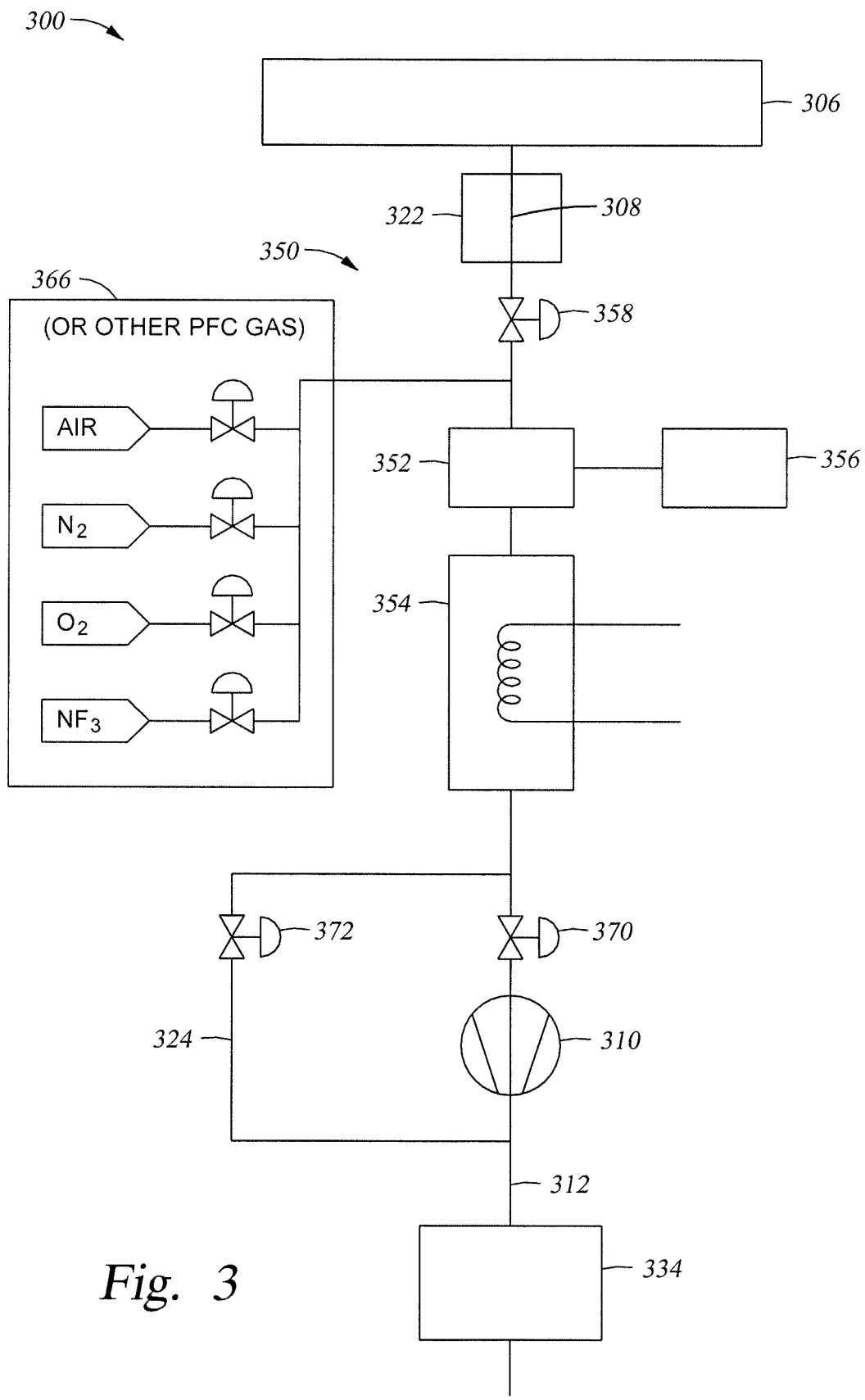
FIG. 3 illustrates a schematic diagram of a vacuum processing system, according to certain aspects of the present disclosure.

FIG. 3 is a schematic diagram of a vacuum processing system 300 incorporating a foreline plasma reactor subsystem 350, according to one embodiment of the present disclosure. The vacuum processing system 300 shown in FIG. 3 is similar to the vacuum processing system 100 shown in FIG. 1, but with additional components useful for maintenance of the foreline plasma reactor subsystem illustrated.

The vacuum processing system 300 includes a vacuum processing chamber 306 such as an etch reactor processing chamber, an ion implant chamber, a plasma treatment chamber, an atomic layer deposition chamber, etc. In the embodiment depicted in FIG. 3, vacuum processing chamber 306 is a CVD chamber. A heater 322 may be disposed adjacent to the foreline 308 to heat the foreline 308 and exhaust gases.

In one embodiment, the foreline plasma reactor subsystem 350 includes a plasma source 352, a foreline gas chiller (i.e., trap) 354, a treatment agent (e.g., reactant gas) source 356, a maintenance purge gas supply 366, a first valve 358, a second valve 370, and a maintenance vent valve 372. The first valve 358 is disposed on the foreline 308 between the vacuum processing chamber 306 and the foreline plasma reactor subsystem 350. The maintenance purge gas supply 366 connects to the foreline 308 between the first valve 358 and the plasma source 352. The maintenance purge gas supply 366 supplies a purge gas (e.g., air, nitrogen $N_2$, oxygen $O_2$, nitrogen trifluoride $NF_3$, or a perfluorocarbon (PFC)) to the foreline plasma reactor subsystem in order to purge exhaust gases (e.g., the exhaust stream) from the foreline plasma reactor subsystem 350, e.g., as part of maintenance activities.

The plasma source 352 is disposed downstream of the maintenance purge gas supply 366, and upstream of the foreline gas chiller 354. The maintenance vent valve 372 connects to the foreline 308 downstream of the foreline gas chiller 354. A second valve 370 is disposed between the maintenance vent valve 372 connection to the foreline 308 and the process vacuum pump 310. The foreline 308 allows exhaust gases (e.g., an exhaust stream) to flow from the vacuum processing chamber 306 to the first valve 358, from the first valve 358 to the plasma source 352, from the plasma source 352 to the foreline gas chiller 354, from the foreline gas chiller 354 to the maintenance vent valve 372 and the second valve 370, and from the second valve 370 to a process vacuum pump 310. A maintenance line 324 allows gases to flow from the maintenance vent valve 372 to an abatement subsystem 334.

An exhaust line 312 allows gases to flow from the process vacuum pump 310 to the abatement subsystem 334. The plasma source 352, foreline 308, process vacuum pump 310, first valve 358, second valve 370, maintenance vent valve 372, maintenance line 324, and associated hardware may be formed from one or more process-compatible materials, such as aluminum, anodized aluminum, nickel plated aluminum, stainless steel, and combinations and alloys thereof, for example. The foreline gas chiller 354 may be formed of similar process-compatible materials, or may be formed of materials conducive to condensation of the exhaust gases, for example. The abatement subsystem 334 may be a burn/wet abatement subsystem, as is known in the semiconductor fabrication industry, for example.

Figure 4:
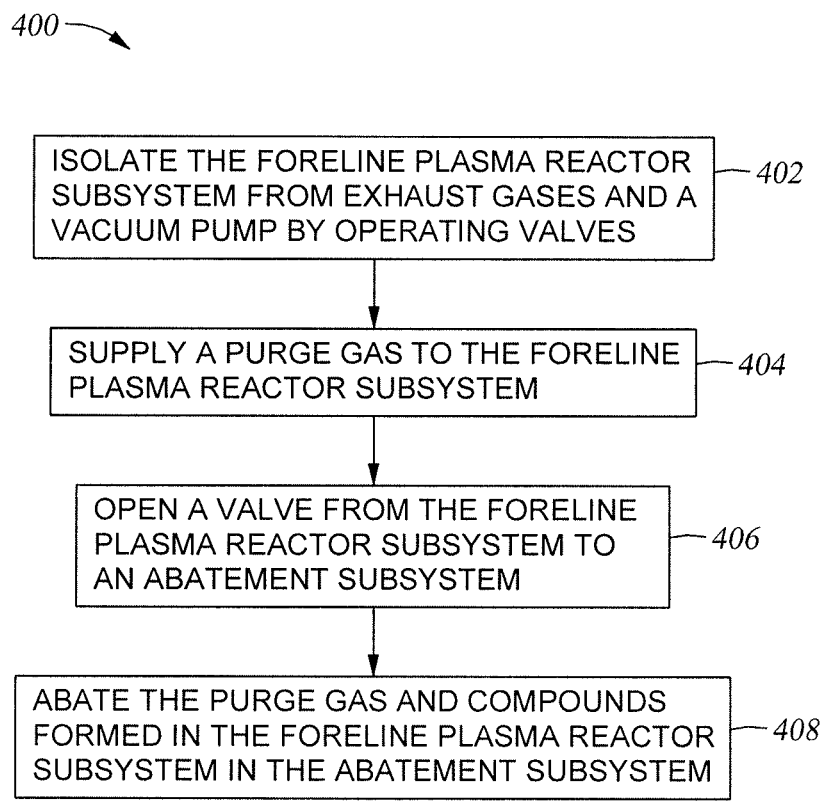
FIG. 4 illustrates an exemplary operation for maintaining a foreline plasma reactor subsystem used in vacuum processing, according to certain aspects of the present disclosure.

FIG. 4 illustrates an exemplary operation 400 for maintaining (e.g., cleaning) a foreline plasma reactor subsystem used in a vacuum processing system, such as a chemical vapor deposition (CVD) system. The operation 400 begins at block 402 by isolating the foreline plasma reactor subsystem from exhaust gases and a vacuum pump by operating valves. For example, with reference to FIG. 3, first valve 358 and second valve 370 may be operated to isolate the foreline plasma reactor subsystem 350 from the vacuum processing chamber 306 and the process vacuum pump 310.

The operation 400 (see FIG. 4) continues at block 404 by supplying (i.e., introducing) a purge gas to the foreline plasma reactor subsystem. For example (see FIG. 3), the foreline plasma reactor subsystem 350 may be purged with a controlled flow rate of oxygen $O_2$ introduced from the maintenance purge gas supply 366 to ensure complete reaction of any remaining reactive or pyrophoric compounds (from, e.g., an exhaust stream), followed by nitrogen $N_2$ purging to allow the foreline plasma reactor subsystem 350 to be removed for cleaning and maintenance.

At block 406 (see FIG. 4), the operation continues by opening a valve from the foreline plasma reactor subsystem to an abatement subsystem (e.g., a burn/wet abatement subsystem). For example (see FIG. 3), the maintenance vent valve 372 may be opened between the foreline 308 and the maintenance line 324.

The operation 400 (see FIG. 4) continues at block 408 by abating the purge gases and compounds, formed (e.g., from the purge gases and exhaust gases) in the foreline plasma reactor subsystem, in the abatement subsystem. For example (see FIG. 3), nitrogen $N_2$ and oxygen $O_2$ purge gases, reacted exhaust gas, and particles may flow to the abatement subsystem 334 (e.g., a burn/wet abatement system) and be abated.

Figure 5:
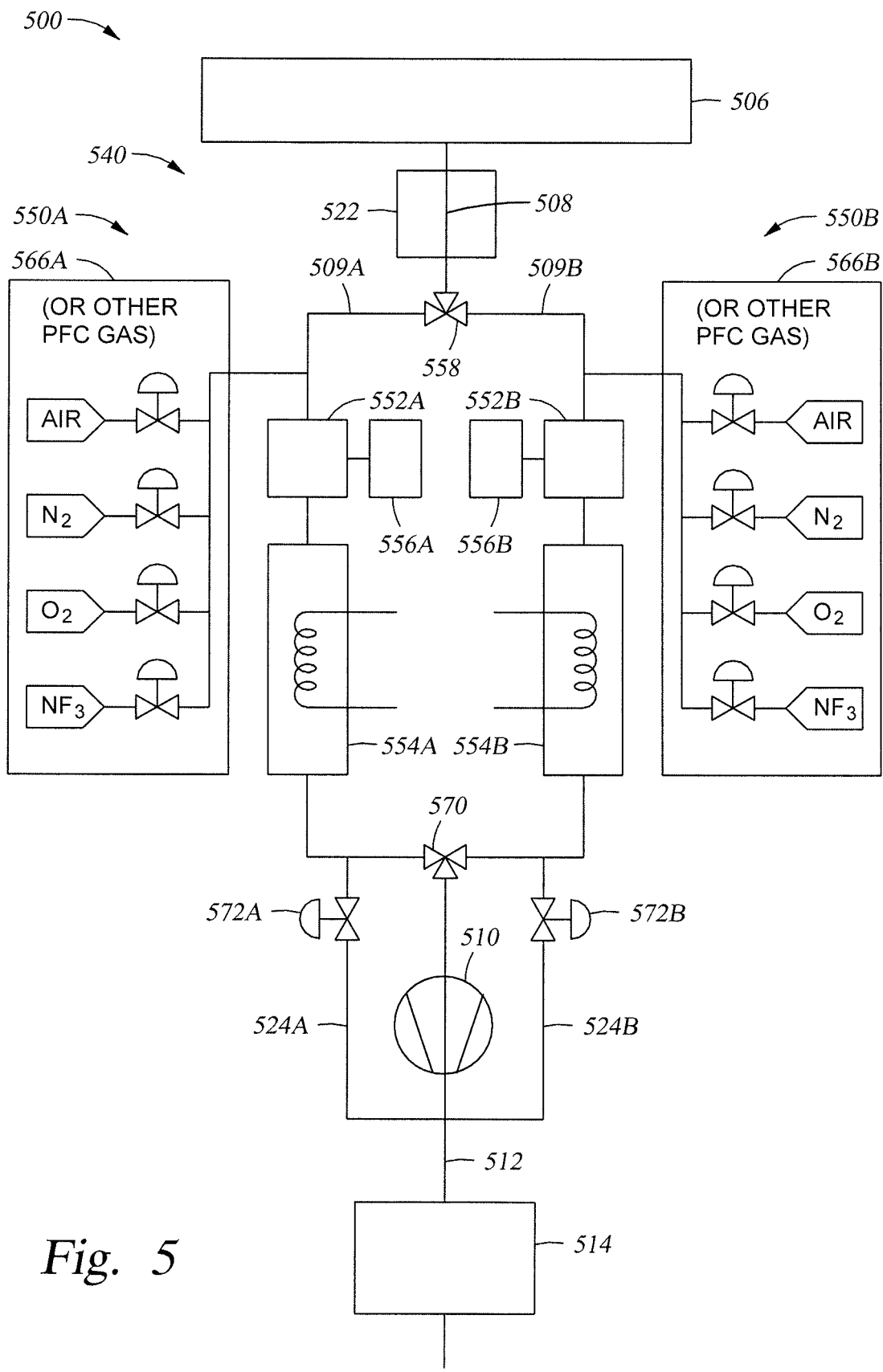
FIG. 5 illustrates a schematic diagram of a vacuum processing system, according to certain aspects of the present disclosure.

FIG. 5 illustrates a schematic diagram of a vacuum processing system 500 incorporating a foreline plasma reactor system 540 comprising a first foreline plasma reactor subsystem 550A and a second foreline plasma reactor subsystem 550B, according to one embodiment of the present disclosure. While the foreline plasma reactor system 540 is illustrated with two foreline plasma reactor subsystems 550A and 550B, the present disclosure is not so limited and any number of foreline plasma reactor subsystems may be included in a foreline plasma reactor system of a vacuum processing system. The vacuum processing system 500 shown in FIG. 5 is similar to the vacuum processing system 300 shown in FIG. 3, but with additional components illustrated. The additional components allow simultaneous operation of a vacuum processing chamber 506 and maintenance of one of the foreline plasma reactor subsystems 550A and 550B. The vacuum processing system 500 includes a foreline 508, the foreline plasma reactor system 540, a process vacuum pump 510, an exhaust line 512, an abatement subsystem 514, and a vacuum processing chamber 506. The foreline plasma reactor system 540 includes a first valve 558, a second valve 570, the first foreline plasma reactor subsystem 550A, and the second foreline plasma reactor subsystem 550B. The vacuum processing chamber 506 may be an etch reactor processing chamber, an ion implant chamber, a plasma treatment chamber, an atomic layer deposition chamber, etc. In the embodiment depicted in FIG. 5, the vacuum processing chamber 506 is a CVD chamber. A heater 522 may be disposed adjacent to the foreline 508 to heat the foreline 508 and exhaust gases within the foreline 508.

In one embodiment, the two foreline plasma reactor subsystems 550A and 550B include forelines 509A and 509B, plasma sources 552A and 552B, treatment agent (e.g., reactant gas) sources 556A and 556B, foreline gas chillers (i.e., traps) 554A and 554B, maintenance purge gas supplies 566A and 566B, and maintenance vent valves 572A and 572B.

The first valve 558 is disposed to connect the foreline 508 with the forelines 509A and 509B, between the vacuum processing chamber 506 and the foreline plasma reactor subsystems 550A and 550B. The maintenance purge gas supplies 566A and 566B connect to the forelines 509A and 509B between the first valve 558 and the plasma sources 552A and 552B. According to certain embodiments, the maintenance purge gas supplies 566A and 566B are one supply, with valves and pipes connecting to each of the forelines 509A and 509B.

The plasma sources 552A and 552B are disposed downstream of the maintenance purge gas supplies 566A and 566B, and upstream of the foreline gas chillers 554A and 554B. The maintenance vent valves 572A and 572B connect to the forelines 509A and 509B downstream of the foreline gas chillers 554A and 554B. The second valve 570 is disposed between the maintenance vent valve connections and the process vacuum pump 510.

The foreline 508 allows exhaust gases to flow from the vacuum processing chamber 506 to the first valve 558. The forelines 509A and 509B allow exhaust gases to flow from the first valve 558 to the plasma sources 552A or 552B, from the plasma sources 552A and 552B to the foreline gas chillers 554A and 554B, from the foreline gas chillers 554A and 554B to the maintenance vent valves 572A and 572B and the second valve 570, and from the second valve 570 to a process vacuum pump 510. Maintenance lines 524A and 524B allow gases to flow from the maintenance vent valves 572A and 572B to an abatement subsystem 514. The exhaust line 512 allows gases to flow from the process vacuum pump 510 to the abatement subsystem 514.

The plasma sources 552A and 552B, foreline 508, forelines 509A and 509B, process vacuum pump 510, first valve 558, second valve 570, maintenance vent valves 572A and 572B, maintenance lines 524A and 524B, and associated hardware may be formed from one or more process-compatible materials, such as aluminum, anodized aluminum, nickel plated aluminum, stainless steel, and combinations and alloys thereof, for example. The foreline gas chillers 554A and 554B may be formed of similar process-compatible materials, or may be formed of materials conducive to condensation of the exhaust gases, for example. The abatement subsystem 514 may be a burn/wet abatement subsystem, as is known in the semiconductor fabrication industry, for example.

Figure 6:
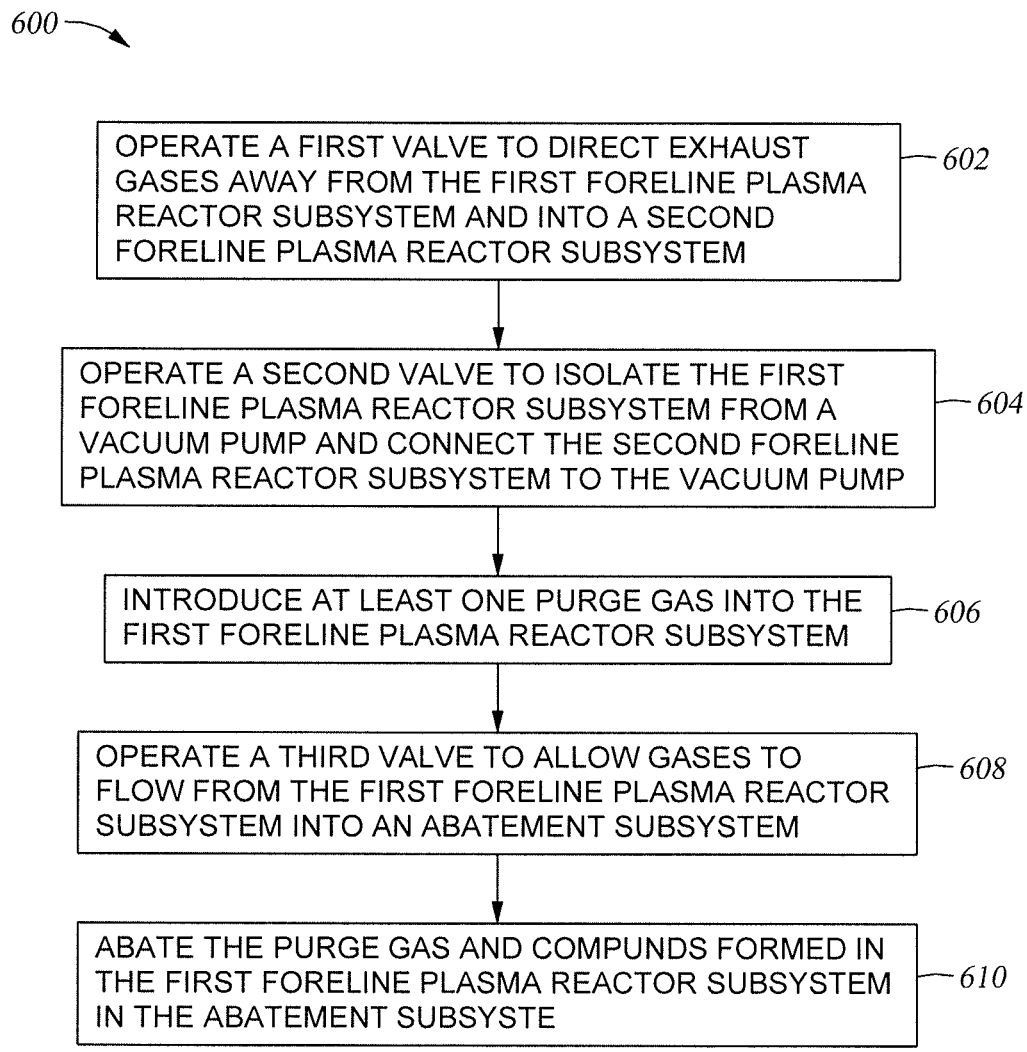
FIG. 6 illustrates an exemplary operation for treating exhaust gases of a vacuum processing system, according to certain aspects of the present disclosure.

FIG. 6 illustrates an exemplary operation 600 for treating exhaust gases from vacuum processing (e.g., CVD) operations while simultaneously maintaining (e.g., cleaning) a first foreline plasma reactor subsystem. The operation 600 begins at block 602 by operating a first valve to direct exhaust gases away from the first foreline plasma reactor subsystem and into a second foreline plasma reactor subsystem. For example, with reference to FIG. 5, first valve 558 may be operated to isolate the first foreline plasma reactor subsystem 550A, comprising plasma source 552A and foreline gas chiller 554A, from the vacuum processing chamber 506 and connect the second foreline plasma reactor subsystem 550B, comprising plasma source 552B and foreline gas chiller 554B, with the vacuum processing chamber 506.

The operation 600 (see FIG. 6) continues at block 604 by operating a second valve to isolate the first foreline plasma reactor subsystem from a vacuum pump and connect the second foreline plasma reactor subsystem with the vacuum pump. For example (see FIG. 5), second valve 570 may be operated to isolate the first foreline plasma reactor subsystem 550A, comprising plasma source 552A and foreline gas chiller 554A, from the process vacuum pump 510 and connect the second foreline plasma reactor subsystem 550B, comprising plasma source 552B and foreline gas chiller 554B, with the process vacuum pump 510.

At block 606 (see FIG. 6), the operation 600 continues by introducing at least one purge gas to the first foreline plasma reactor subsystem. For example (see FIG. 5), maintenance purge gas supply 566A may supply nitrogen $N_2$ and oxygen $O_2$ to the foreline 509A upstream of the plasma source 552A.

At block 608 (see FIG. 6), the operation 600 continues by operating a third valve to allow gases to flow from the first foreline plasma reactor subsystem into an abatement subsystem. For example (see FIG. 5), the maintenance vent valve 572A may be opened between the foreline 509A and the maintenance line 524A.

The operation 600 (see FIG. 6) continues at block 610 by abating the purge gas and compounds formed in the first foreline plasma reactor subsystem in the abatement subsystem. For example, nitrogen and oxygen purge gases, reacted waste gases, and particles may flow to the abatement subsystem 514 and be abated.

A system controller (not shown) can be used to regulate the operations of the vacuum processing systems 100, 300, and 500. The system controller can operate under the control of a computer program stored on a hard disk drive of a computer. For example, the computer program can dictate the process sequencing and timing, mixture of gases, chamber pressures, RF power levels, susceptor positioning, slit valve opening and closing, and other parameters of a particular process.

To provide a better understanding of the foregoing discussion, the above non-limiting examples are offered. Although the examples may be directed to specific embodiments, the examples should not be interpreted as limiting the disclosure in any specific respect.

While the foregoing is directed to embodiments of the present disclosure, other and further embodiments of the disclosure may be devised without departing from the basic scope thereof, and the scope thereof is determined by the claims that follow.

What is claimed is:

1. A foreline plasma reactor system for treating exhaust gases of a vacuum processing system, comprising:
   a first plasma source having a first inlet and an outlet;
   a first downstream trap coupled to the outlet of the first plasma source; and
   a first valve operable to selectively direct exhaust gases between a first flow path and a second flow path, the first flow path coupled to the first inlet of the first plasma source, the second flow path bypassing the first plasma source and the first downstream trap.

2. The foreline plasma reactor system of claim 1, further comprising:
   a pump; and
   a second valve operable to selectively connect the first flow path and the second flow path to the pump.

3. The foreline plasma reactor system of claim 1, further comprising:
   a first maintenance purge gas supply coupled to the first flow path and configured to provide gas to the first inlet of the first plasma source.

4. The foreline plasma reactor system of claim 1, further comprising:
   a first treatment agent source coupled to a second inlet of the first plasma source.

5. The foreline plasma reactor system of claim 4, wherein the first treatment agent source is configured to supply oxygen to the first plasma source.

6. The foreline plasma reactor system of claim 1, wherein the first downstream trap comprises a cooling element configured to condense the exhaust gases on internal surfaces of the first downstream trap.

7. The foreline plasma reactor system of claim 6, wherein the cooling element comprises a cooling coil.

8. The foreline plasma reactor system of claim 6, wherein the cooling element comprises a cooled collection plate.

9. The foreline plasma reactor system of claim 3, wherein the first maintenance purge gas supply is configured to supply nitrogen to the first inlet of the first plasma source.

10. The foreline plasma reactor system of claim 3, wherein the first maintenance purge gas supply is configured to supply a perfluorocarbon to the first inlet of the first plasma source.

11. The foreline plasma reactor system of claim 2, further comprising:
    a maintenance vent valve operable to allow gases from the first downstream trap to bypass the pump.

12. The foreline plasma reactor system of claim 1, further comprising:
    a second plasma source disposed in the second flow path, the second plasma source having a first inlet coupled to the first valve; and
    a second downstream trap coupled to an outlet of the second plasma source.

13. The foreline plasma reactor system of claim 12, further comprising:
    a second maintenance purge gas supply coupled to the second flow path and configured to provide gas to the first inlet of the second plasma source.

14. The foreline plasma reactor system of claim 12, further comprising:
    a second treatment agent source coupled to a second inlet of the second plasma source.

15. The foreline plasma reactor system of claim 12, wherein the second downstream trap comprises a cooling element configured to condense the exhaust gases on internal surfaces of the second downstream trap.

16. The foreline plasma reactor system of claim 12, further comprising:
    a pump; and
    a second valve operable to selectively connect the first flow path and the second flow path to the pump.

17. The foreline plasma reactor system of claim 16, further comprising:
    a first maintenance vent valve operable to allow gases from the first downstream trap to bypass the pump; and
    a second maintenance vent valve operable to allow gases from the second downstream trap to bypass the pump.

18. A foreline plasma reactor system for treating exhaust gases of a vacuum processing system, comprising:
- a first foreline subsystem;
- a second foreline subsystem;
- a first valve operable to selectively direct exhaust gases between the first foreline subsystem and the second foreline subsystem;
- a pump; and
- a second valve operable to selectively connect the first foreline subsystem and the second foreline subsystem to the pump, wherein each foreline subsystem comprises:
  - a plasma source having a first inlet coupled to the first valve;
  - a downstream trap coupled between an outlet of the plasma source and the second valve, wherein the downstream trap comprises a cooling element configured to condense the exhaust gases on internal surfaces of the downstream trap; and
  - a treatment agent source coupled to a second inlet of the plasma source.

19. The foreline plasma reactor system of claim 18, wherein each foreline subsystem comprises:
- a maintenance purge gas supply configured to provide gas to the first inlet of the plasma source downstream of the first valve.

20. The foreline plasma reactor system of claim 18, further comprising:
- a first maintenance vent valve operable to allow gases from the downstream trap of the first foreline subsystem to bypass the pump; and
- a second maintenance vent valve operable to allow gases from the downstream trap of the second foreline subsystem to bypass the pump.

* * * * *